United States Patent
Rijshouwer et al.

(10) Patent No.: US 9,490,848 B2
(45) Date of Patent: Nov. 8, 2016

(54) DATA HANDLING SYSTEM COMPRISING MEMORY BANKS AND DATA REARRANGEMENT

(75) Inventors: Erik Rijshouwer, Eindhoven (NL); Cornelis Hermanus van Berkel, Heeze (NL)

(73) Assignee: NXP B.V., Eindhoven (NL)

( * ) Notice: Subject to any disclaimer, the term of this patent is extended or adjusted under 35 U.S.C. 154(b) by 720 days.

(21) Appl. No.: 12/994,061

(22) PCT Filed: May 19, 2009

(86) PCT No.: PCT/IB2009/052081
§ 371 (c)(1),
(2), (4) Date: Nov. 22, 2010

(87) PCT Pub. No.: WO2009/141789
PCT Pub. Date: Nov. 26, 2009

(65) Prior Publication Data
US 2011/0078360 A1    Mar. 31, 2011

(30) Foreign Application Priority Data
May 21, 2008  (EP) .................... 08104057

(51) Int. Cl.
| H03M 13/27 | (2006.01) |
| G11C 7/10 | (2006.01) |
| H03M 13/00 | (2006.01) |

(52) U.S. Cl.
CPC ........ H03M 13/2707 (2013.01); G11C 7/1006 (2013.01); H03M 13/6566 (2013.01)

(58) Field of Classification Search
CPC ............... G06F 9/3879; G06F 9/3897; G06F 12/0246; G06F 11/1662; G06F 11/302; G06F 11/3051; G06F 11/3055; G06F 11/3093; G11C 7/1006; H03M 13/2707; H03M 13/6566

USPC .......... 711/5, 100, 105, 106, 114, 165, 166, 711/205–208; 365/220, 222
See application file for complete search history.

(56) References Cited

U.S. PATENT DOCUMENTS

| 5,938,763 A | 8/1999 | Fimoff et al. |
| 6,360,311 B1 | 3/2002 | Zandveld et al. |

(Continued)

FOREIGN PATENT DOCUMENTS

| CN | 101032085 A | 9/2007 |
| EP | 1 324 502 A2 | 7/2003 |

(Continued)

OTHER PUBLICATIONS

Vanne, J., et al. "Enhanced Configurable Parallel Memory Architecture", Proc. Euromicro Symp. of Digital System Design, 2002, Sep. 4-6, 2002, IEEE, Piscataway, NJ, US, pp. 28-35, (Sep. 4, 2002).

(Continued)

Primary Examiner — Zhuo Li (57) ABSTRACT

It is an object of the invention to provide a memory architecture that can handle data interleaving efficiently. This and other objects are achieved by the system according to the invention. The data handling system, is configured for receiving at an input a plurality of commands. The system comprises: a plurality of memory banks; a distributor connected to the input and having a plurality of distributor outputs. Each specific one of the plurality of memory banks (106) is connected to a specific one of the plurality of distributor outputs. The distributor comprises a permutator for designating for each specific command a specific distributor output. The distributor distributes the specific command to the specific designated distributor output. The permutator has a control input and the designating is reconfigurable under the control of reconfiguration data received at the control input.

9 Claims, 4 Drawing Sheets (56) References Cited

U.S. PATENT DOCUMENTS

| | | | |
|---|---|---|---|
| 6,415,353 B1 * | 7/2002 | Leung | 711/106 |
| 6,901,492 B2 | 5/2005 | Berens et al. | |
| 7,170,849 B1 | 1/2007 | Arivoli et al. | |
| 2003/0014700 A1 | 1/2003 | Giulietti et al. | |
| 2007/0195627 A1 | 8/2007 | Kim | |

FOREIGN PATENT DOCUMENTS

| | | | |
|---|---|---|---|
| EP | 1324502 A2 * | 7/2003 | |
| EP | 1 746 731 A1 | 1/2007 | |
| EP | 1 931 035 A1 | 6/2008 | |
| WO | 2009141789 A1 | 11/2009 | |

OTHER PUBLICATIONS

International Search Report and Written Opinion for Int'l patent appln. No. PCT/IB2009/052081 (Oct. 26, 2009)xxx.

International Search Report and Written Opinion in PCT/IB2009/052078 dated Oct. 6, 2009.

Eero, Aho, "Configurable Data Memory for Multimedia Processing", Journal of Signal Processing Systems, vol. 50, No. 2, Aug. 16, 2007, pp. 231-249.

Harper, D, et al. "Vector Access Performance in Parallel Memories Using a Skewed Storage Scheme", IEEE Trans. on Computers, vol. C-36, No. 12, pp. 1440-1449 (Dec. 1987).

Hoffman, J., et al. "Overview of the Scalable Communications Core," IEEE Symposium on VLSI (ISVLSI '07), pp. 3-8 (2007).

\* cited by examiner

DATA HANDLING SYSTEM COMPRISING MEMORY BANKS AND DATA REARRANGEMENT

FIELD OF THE INVENTION

The invention relates to a data handling system.

In particular, the invention relates to a data handling system, wherein: the system is configured for receiving at an input a plurality of commands, the system comprises a plurality of memory banks.

The invention also relates to a method for data handling.

The invention also relates to a method for rearranging data.

The invention also relates to a computer program product.

BACKGROUND OF THE INVENTION

In virtually every modern transmission or reception device, such as those for, e.g., GSM and UMTS R99, a data interleaving step, i.e. a data reordering step, is used.

Data interleaving is the process of reordering the data according to some predetermined pattern. Typically, the interleaving uses a block interleaving pattern, wherein the data is organized in a rectangular matrix. First the whole interleaving block is written to the memory according to a well-chosen access sequence, and then the block is read out by means of the second access sequence. For example, the matrix is written in the order of the rows but read in the order of the columns. These sequences combined implement the required interleaving operation.

Note that by using an interleaving scheme's access sequences, while swapping the reading and writing commands, its associated deinterleaving scheme is obtained. For example, the matrix is written in the order of the columns but read in the order of the rows. A data interleaver and corresponding deinterleaver are typically implemented as write and read sequences to a Random access memory (RAM).

Interleaving has an inherent high latency associated with its operation because of its data dependencies.

Interleaving has numerous applications in the area of computer science, error correcting codes and communications. For example, if data is interleaved prior to encoding with an error correcting code the data becomes less vulnerable to burst errors. The latter is especially important for communications, including mobile communications, but is also used for data storage. Data interleaving can also be used for multiplexing multiple sources of digital streams, for example, to combine a digital audio stream and a digital video stream into one multimedia stream.

If the required data-rates are low, often programmable solutions on a DSP or micro-controller are used. For higher data-rates and/or throughput requirements a random access memory with dedicated address generation hardware is used, for example, for WLAN.

The throughput requirements on a memory used for interleaving have been constantly rising. The most important reason for this is the increasing data rates required by the communication standards. To give an indication of this increase, the throughput requirements for 3 G communication standards are given below in Table 1 below, along with a next generation in the Table 2 below. Note: Msbit/s stands for Mega soft-bits per second, which is a measurement of data rate. One soft-bit corresponds with 4 or 5 real bits, depending on the precision used by the demodulator.

TABLE 1

| 3G Standards | |
| --- | --- |
| Standard | Throughput |
| 802.11a/g | 72 Msbit/s |
| DAB | 4.6 Msbit/s |
| DVB | 81 Msbit/s |
| UMTS | 8.8 Msbit/s |
| HSDPA | 42 Msbit/s |

TABLE 2

| 4G Standards | |
| --- | --- |
| Standard | Throughput |
| UMTS LTE | 300 Msbit/s |
| 802.11n | 600 Msbit/s |

Furthermore, upstream and downstream activities often have to be supported simultaneously, leading to a higher architecture load. Also, multi-standard solutions not only have to process the sum of the individual data rates, but can be stressed even further because of tight latency constraints. The result of these developments is that the sum of access rates on the memory has become much larger than the maximally attainable memory frequency.

If a multi-bank memory is used, a new problem arises: if two or more elements of an access vector are assigned to the same bank a so-called conflict occurs since a single bank can only process one element at a time. For example, such a conflict occurs if an access vector, i.e. a command vector, contains two write commands destined for the same memory bank. The distributor can resolve this conflict by splitting the access vector up into two new access vectors such that each new access vector comprises only one of the two addresses that gave rise to the conflict. As a result, two cycles are used to process the original access vector. This corresponds with a memory efficiency of 50%.

Depending on the characteristics of the interleaving scheme, it is seldom possible to process many consecutive access vectors without having bank conflicts.

The worst-case scenario for bank conflicts occurs for certain block interleaving access patterns. If the number of banks, P, is a divider of the number of columns, C, of the matrix, i.e. the block interleaving function, a total of C bursts of bank conflicts occur. In this case the memory efficiency drops to only 1/P*100%. In particular, this situation occurs in the situation where the number of columns is equal to the number of banks used.

It is a problem of known memory architectures that they are inefficient if used for data interleaving.

SUMMARY OF THE INVENTION

It is an object of the invention to provide a memory architecture that can handle data interleaving efficiently.

This and other objects are achieved by the system according to the invention. The data handling system is configured for receiving at an input a plurality of commands. The system comprises: a plurality of memory banks; a distributor connected to the input and having a plurality of distributor outputs. Each specific one of the plurality of memory banks (106) is connected to a specific one of the plurality of distributor outputs. The distributor comprises a permutator for designating for each specific command a specific distributor output. The distributor distributes the specific command to the specific designated distributor output. The permutator has a control input and the designating is reconfigurable under the control of reconfiguration data received at the control input.

The inventors have realized that for a given access pattern caused by, e.g., an interleaving scheme, bank conflicts can be avoided by way of a suitable permutation of the commands. If the permutator causes a better distribution of the commands over the memory banks the number of conflicts is reduced. However, a permutation that is beneficial for some access pattern may be disadvantageous for another. The term 'disadvantageous' means that the number of conflicts introduced by the permutation is larger than the number of conflicts it prevents. A solution to this dilemma is to make the permutator reconfigurable so that for each interleaving scheme a beneficial permutation or no permutation at all, can be selected.

It is a problem that some interleaving patterns, including some interleaving patterns that are needed for common communication standards, give rise to many bank conflicts. The situation described above will happen often for such interleaving patterns.

This problem is solved by using a permutator. The permutator applies a permutation to the distribution, such that an interleaving pattern that causes many commands to be distributed to a single memory bank is transformed into a pattern in which those commands are distributed among multiple banks.

If the distributor receives a plurality of commands that without a permutator would give rise to many bank conflicts, i.e. many commands would be sent to the same memory bank, the permutator breaks this pattern by assigning or redistributing some of the commands to a different memory bank and possibly via a corresponding access module.

For example, if, without a permutator, a first command and a second command were sent to a first memory bank, then the permutator could resolve this conflict by assigning the first command to the first memory bank but the second command to a second memory bank, different from the first.

Note that the permutator can operate on read commands and write commands. It is convenient that a read command, issued to retrieve an element stored in response to a previous write command, is routed through the same permutator operating in the same configuration. In that way a read or write command comprising the same index will read from, or write to, the same physical location.

The permutator could be comprised in a clearly defined module, but on the other hand, the functionality of the permutator could be combined with the functionality of other modules, especially with a module for processing addresses or indices. For example, the permutator may be combined with the distributing of the distributor. The permutator could also be implemented outside the distributor, for example, in a separate module connected to the distributor outputs and the inputs of the plurality of access modules.

A permutator has the advantage that access modules will be fully occupied less frequently. As a result of using the permutator, the capacity of the access module may be reduced, leading to a cheaper design.

The invention using a permutator may be used to advantage in any device or for any application requiring high data rates, even if the memory access behavior is not balanced over the banks.

Through the control input a permutation can be selected that reduces the number of memory bank conflicts, for an intended subsequent use of the data handling system. As the number of memory bank conflicts is reduced the data handing system works more efficiently since more command can be handled in parallel. Since the permutation is reconfigurable through the control input, more than one access scheme, e.g., interleaving scheme, can be supported in an optimal, or near optimal, or at least in a more suitable, way.

A command can comprise, or consist of, an index representing a memory location. An index could be a memory address, but the index could also be an index as used in a block interleaving pattern. The range of indices need not encompass the whole address range of the memory. A translation function may be necessary to convert an index into a physical address. The translation function may comprise adding an offset to the index. The translation function may, as an intermediate step, translate the index to a virtual address. The translation function may be comprised in the distributor and/or a memory bank. The translation function may also be comprised in a translator unit, such as a memory management unit, employed by the data handling system.

The plurality of commands can be organized temporally in many ways, e.g., the commands may arrive at the input sequentially or in parallel. There is no need for the commands to arrive according to a fixed schedule but the commands can arrive as soon as a processing device upstream makes them available. In this way, the data handling system can be used in an asynchronous design.

The invention may be used to advantage in any device or for any application requiring high data rates, as long as the memory access behavior is more or less balanced over the banks.

In a practical embodiment of the data handling system according to the invention, at least one specific memory bank of the plurality of memory banks is connected to the specific distributor output through a specific access module. The specific access module is configured to buffer at least one command occurring at the specific distributor output.

If a bank conflict occurs in the plurality of commands, the distributor does not need to resolve this conflict, but can continue regular operation, since each bank has a corresponding access module to buffer the conflicting commands. These access modules enable the decoupling of commands for the different banks by rescheduling.

As a result all memory banks can, if the access modules are non-empty, store or retrieve a data object in each cycle, whereas without the plurality of access modules, some of the memory banks would be idle when a conflict occurs.

Because the permutation is selected to be well suited to the intended use of the data handling system, the number of bank conflicts will be reduced, compared to the number of bank conflicts in a default distribution pattern. The necessary size of the buffer in an access module is determined by the number of consecutive conflicts the access module should be able to handle. If fewer consecutive conflicts occur, the access buffers can be smaller.

For a particular bank, all read accesses or write accesses are still executed in the relative order in which they were received by the distributor. As a result no Read after Write (RAW), Write after Read (WAR) or Write after Write (WAW) hazards can occur in this architecture.

A hazard preventing control means, such as a means for stalling the data handling system before a hazard occurs, is not needed for the architecture according to the invention. This has the advantage of a higher throughput of the data handling system and less complicated hardware.

As a result of processing a plurality of read commands, a buffer comprised in an access module may get full. If an access module is full, the data handling system cannot accept new read commands that could be distributed to the distributor output that is connected to the access module that is full. If such a situation is unaccounted for, the data handling system may fail or at least the throughput will suffer. An access buffer may become full if a plurality of commands is received with many bank conflicts, that is, many commands for the same bank. The occurrence of full access buffers is reduced with a reconfigurable permutator.

In a practical embodiment of the data handling system according to the invention, each specific memory bank of the plurality of memory banks is connected to the specific distributor output through a specific access module. The specific access module is configured to buffer at least one command occurring at the specific distributor output.

In a practical embodiment of the data handling system according to the invention, the system comprises an output, wherein: the plurality of commands comprises at least one read command; and each specific one of the plurality of memory banks is configured for producing at the output a particular data object in response to receiving a particular read command from the distributor.

Reducing conflicts is especially important for an input sequence of read commands in the presence of access modules. Two conflicting parallel read commands end up in the same access buffer one after the other. As a result they will end up at different places in the output data objects, e.g., in different output data object vectors. In theory, a user of the data handling system, e.g. a software programmer, could account for the rearrangement that takes place as a result of conflicts. For example, this can be done, by introducing such permutations in a sequence of read commands that the permutation precisely counteract the rearrangement that occurs as a result of conflicts. Clearly, this is an undesirable situation as it adds significant additional complexity to the software. Reducing conflicts, in an ideal situation, to zero, mitigates or solves this problem.

In a practical embodiment of the invention, the plurality of commands comprises at least one write command. The write command comprises a data object. Each specific one of the plurality of memory banks is configured for storing a particular data object in response to receiving a particular write command from the distributor.

Also for write commands, bank conflicts are problematic, as they cause the data handling system to operate with lower efficiency.

In a preferred embodiment of the invention, the plurality of commands is organized as a first sequence of command vectors. The data objects appearing at the output are organized as a second sequence of data object vectors.

Vector machines often employ multi-bank architectures. For such configuration the invention is therefore particularly advantageous.

In a preferred embodiment of the invention each specific command comprises a specific index. The permutator is arranged to designate for each specific command a specific distributor output corresponding to a processing of the specific index.

Using the index allows the permutator to assign a subsequent command with an index to the same memory bank to which a former command with the same index was assigned. Using the index the permutator can achieve this without any other knowledge of the access patterns that are to be used with the data handling system. This makes for a less complicated design, as the permutator does not need information in advance on the precise access patterns.

In a preferred embodiment of the invention the permutator is further arranged to compute a specific address by processing the specific index in accordance with an address function. Each memory bank is arranged to store or retrieve a specific data object in accordance with the specific address. The processing of the specific index comprises adding the specific address to substantially the specific index.

A particularly convenient way to permute the commands is by first processing the indices with an address function. The address that results from processing an index with an address function can represent the physical location in a memory bank where the command is to store or to retrieve. The address may also be a representation for an offset in the memory bank, or displacement with respected to a predetermined element in the memory bank. The address may also represent a virtual, rather than a physical, location. The use of virtual addresses is well known to a person skilled in the art.

A cyclic permutation shift is accomplished, in the processing of the specific index to designate a specific distributor output, by comprising the adding of the specific address to the specific index. After the processing step of adding the specific address to the specific index additional processing may be done. For example, a modulo operation, i.e. a remainder after division operation, in particular, computing modulo the number of memory banks, can be done.

Bank conflicts arise when a sequence of read commands or write commands, in combination with the number of memory banks, is particularly unfortunate. With said combination it may happen that many bank conflicts arise. For example, for the block interleaving pattern, this happens if the number of banks, 'P', is a divisor of the number of columns, 'C'.

By adding the address to the index, commands that would otherwise be distributed to the same bank, need access to different banks. In this way, the cyclic permutation shift resolves many of the bank conflicts.

If the permutator reduces the number of bank conflicts more than the permutator introduces new bank conflicts for some particular interleaving pattern, the permutator is advantageously applied. This can be tested by simulating an interleaving pattern, first without the permutator, and then with the permutator. The number of bank conflicts is counted in both simulations. If the simulation with permutator gives fewer bank conflicts than the simulation without the permutator, then the permutator is advantageously applied.

In a preferred embodiment of the invention the distributor further comprises a stalling module. At least one distinct access module is arranged to signal the stalling module whether the distinct access module is substantially full. The stalling module is arranged to temporarily prevent the distributor from distributing.

If an access module is substantially full, the data handling system must temporarily be prevented from taking in more input, as those cannot be handled. To achieve this, the distributor may comprise a stalling module to collect the stalling information from the plurality of access modules and to forward this information to those sources that may supply the data handling system with more commands.

This feature has the advantage that data loss, unpredictable behavior or, worse, a crash of the data handling system is prevented.

The condition of 'substantially full' must be considered in conjunction with the mode of operation of the access modules and the data handling system, combined with the operation of a containing system in which the data handling system is comprised. The access modules must give a signal ahead of time for the distributor and/or other modules in the containing system to act in time upon the signal. For example, if the operation of the data handling system and/or the containing system is pipe-lined, some commands may be in the pipe line at the moment a stalling signal is given. The commands already in the pipe line may not be conveniently delayable. Therefore allowance must be made for those objects by giving the stalling signal ahead of time. For example, if a certain command cannot be delayed, for example, if the distributor is pipe-lined, the access module must give a stalling signal when capacity for only one more command is left.

The method according to the invention for data handling comprises the steps of: receiving a reconfiguration data; reconfiguring a designating under the control of the reconfiguration data; receiving a specific command; designating for the specific command a specific memory bank; distributing the specific command to the specific memory bank; and retrieving and/or storing a specific data object in response to the specific command.

Other processing steps may be done before, after or in between the steps. The reconfiguration need not be done each time the system is used. The system may use the permutation of the previous use, or may use a default permutation.

The method according to the invention for rearranging data for use in a data handling system comprises the following steps: writing a set of data objects according to a first plurality of write commands; reading the set of data objects according to a second plurality of read commands.

Other processing steps may be done before, after or in between the steps. Moreover, a part of the reading operations and writing operations can be interleaved, i.e. a first number of write commands can be performed, then a second number of read commands, then a third number of write commands and then a fourth number of read commands, etc.

The computer program product comprises computer code for performing the steps of any of the methods according to the invention.

The computer program product includes among others a server comprising the computer code, a storage unit, a processor. The computer code can be fabricated using various well known high-level programming languages, such as, C, C++ or Pascal. The computer code can alternatively be fabricated using low-level programming languages, such as assembly, machine codes or microcode.

For completeness reference is made to U.S. Pat. No. 5,938,763, which discloses a system for interleaving data using an architecture built on the principle of memory reuse by means of the reuse of read addresses, i.e., every read access is followed by a write access to the same memory address.

BRIEF DESCRIPTION OF THE DRAWINGS

The invention is explained in further detail, by way of example and with reference to the accompanying drawings, wherein.

Throughout the Figures, similar or corresponding features are indicated by same reference numerals.

LIST OF REFERENCE NUMERALS 100 a data handling system
101 an input
102 a distributor
103 an output
104 a plurality of access modules
106 a plurality of memory banks
110 an access module
112 a memory bank
600 a permutator
700 a reconfiguration module
702 a control input
800 a stalling module

DETAILED EMBODIMENTS

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described.

For convenience, the data handling system is described for the general embodiment, in which a distributor receives a sequence of command vectors and, in so far the system produces output, an output sequence of data object vectors.

Figure 1:
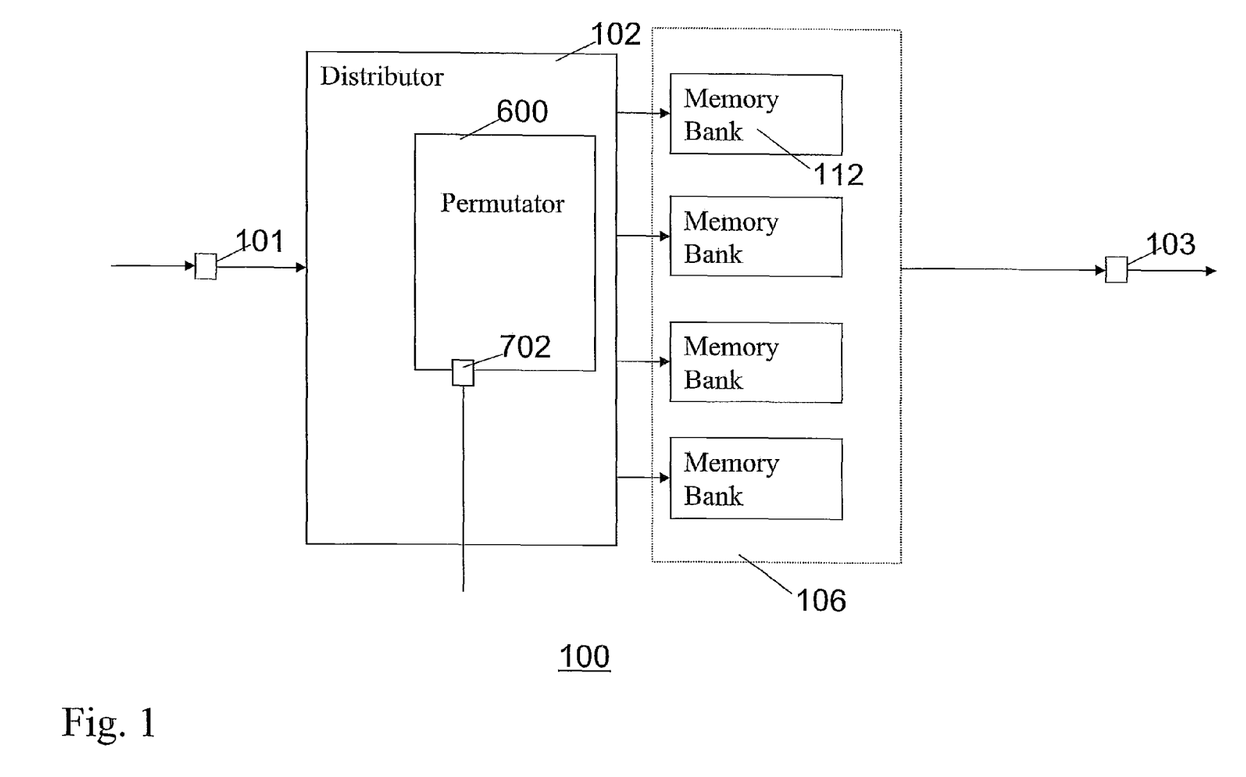
FIG. 1 is a block diagram illustrating a first embodiment of the data handling system according to the invention.

In FIG. 1 a block diagram is shown illustrating a first embodiment of the data handling system (100). The distributor (102) receives at an input (101) a first sequence of command vectors. The first sequence of command vectors can comprise read command vectors and write command vectors. A typical read command comprises an index, such as an address. A typical write command comprises an index and a data object.

The distributor (102) distributes the commands among a plurality of distributor outputs. The plurality of distributor outputs is connected to a plurality of memory banks (106). The connection is done in such a way that each distributor output corresponds to one respective one of memory banks (106). Memory bank (112) is typical for all the memory banks. Each memory bank is capable of retrieving data objects in response to an index or address. Each memory bank is capable of storing a data object.

The distributor (102) comprises a permutator (600) for designating for each specific command a specific distributor output. The permutator (600) has a control input (702), i.e. an input for reconfiguration data and the designating is reconfigurable under the control of reconfiguration data received at the control input (702).

During operation the distributor (102) receives a sequence of command vectors. Typically, first a sequence of write command vectors is received and second a sequence of read command vectors. A write command vector comprises multiple write commands. If a write command vector is received by the distributor (102), the permutator (600) designates a distributor output for each write command in the write command vector. The distributor (102) distributes the write commands to the designated distributor outputs.

If a bank conflict occurs, i.e. if two write commands must be sent to the same memory bank, the distributor (102) splits the write command vector into two or more new write command vectors, such that the write commands that gave rise to the conflict are distributed across two new write command vectors. Alternatively, the distributor (102) may reject such a command vector, possibly generating an error signal.

After the sequence of write command vectors the distributor (102) typically receives a sequence of read command vectors. A read command vector comprises multiple read commands. If a read command vector is received by the distributor (102), the permutator (600) designates a distributor output for each read command in the read command vector. The distributor (102) distributes the read commands to the designated distributor outputs.

As the memory banks (106) receive read commands, they will retrieve the objects stored at the indicated places. As each memory bank outputs data objects, they will be collected into an output data object vector at the output (103). In an ideal situation, the first memory bank will output to the first element of the output data object vector, the second memory bank will output to the second element of the output data object vector, and so on. Some other association between memory banks (106) and output vector places may also be chosen. A relation between memory banks (106) and output places in an output vector need not be fixed.

If no conflicts occur in the read commands, i.e. there are no two read commands in the same read command vector that address the same memory bank, then the output of the memory banks (106) can be directly combined into an output data object vector.

However, if conflicts do occur, a vector collector may be needed. The vector collector ensures that only one read command vector is active in the system at the same time, by stalling the system while a read command vector with conflicts is being processed. If the read command vector comprises two read commands, that address the same memory bank, the system will spend an additional clock cycle to retrieve the two corresponding data objects. After all the data is retrieved, the vector collector assembles the output data object vector and allows the system to receive the next read command vector.

The distributor (102) distributes the contents of the command vectors among the plurality of memory banks (106). The distributor (102) distributes a read command to that memory bank that contains the requested data object. Typically the read command comprises an index that is indicative of the physical location from which the data is to be retrieved. The distributor (102) selects the distributor output connected to the memory bank that comprises the physical location indicated by the index.

The distributor (102) distributes a write command to that distributor output that is connected to a memory bank that is to contain the data object that was supplied with the write command. Typically the write command comprises an index that is indicative of the physical location at which the data is to be stored. The distributor (102) selects the distributor output connected to the memory bank that comprises the physical location indicated by the index.

Figure 2:
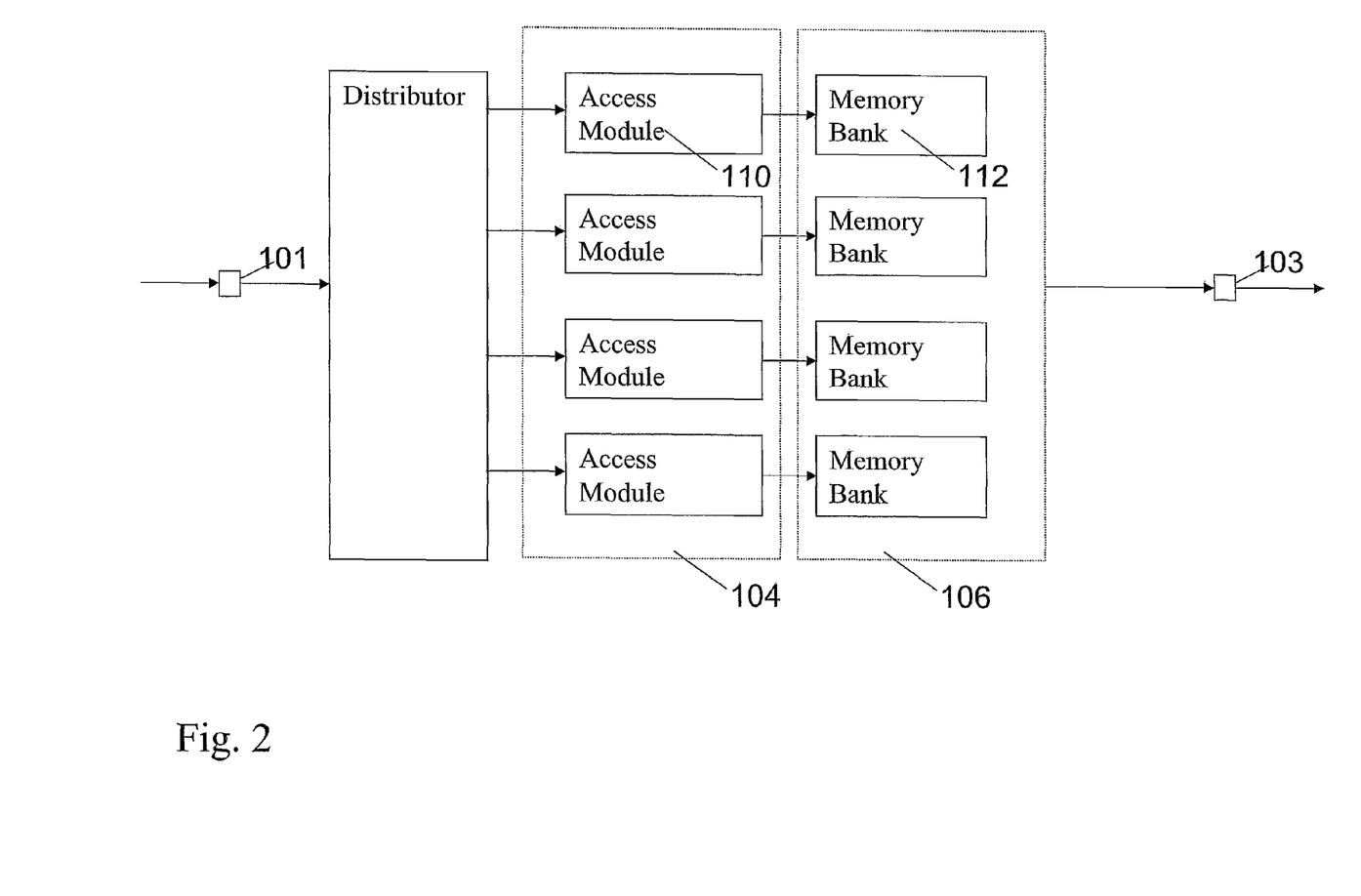
FIG. 2 is a block diagram illustrating a second embodiment of the data handling system according to the invention.

In FIG. 2 a block diagram is shown, illustrating a second embodiment of the data handling system (100). The distributor (102) receives at an input (101) a first sequence of command vectors. The first sequence of command vectors can comprise both read command vectors and write command vectors. A typical read command comprises an index, such as an address. A typical write command comprises an index and a data object.

The distributor (102) distributes the commands among a plurality of distributor outputs. The plurality of distributor outputs is connected to a plurality of access modules (104). The connection is done in such a way that each distributor output corresponds to one respective access module. Access module (110) is typical for all the access modules. Each access module comprises a buffer that is capable of buffering the commands that occur at the distributor output that corresponds to that access module. An access module is capable of buffering read commands and write commands. The distributor (102) need not forward to an access module, the literal command that the distributor (102) has received. Some processing may be done on the command before or during the distributing.

The plurality of access modules (104) is connected to a plurality of memory banks (106). The connection is done in such a way that each access module corresponds to one respective memory bank. Memory bank (112) is typical for all the memory banks. Each memory bank is capable of retrieving data objects in response to receiving an index or address. Each memory bank is capable of storing a data object.

The distributor (102) comprises one distributor output that is connected to access module (110). Access module (110) is connected to memory bank (112). Memory bank (112) stores a data object in response to receiving a write command. Memory bank (112) retrieves a stored data object in response to a read command.

An access module comprises a First In, First Out queue (FIFO queue). The plurality of access modules (104) decouples the processing of accesses, i.e. commands, for the different banks, by rescheduling the accesses in time. Accesses can now be executed out of order. This means that banks need no longer stall each other when faced with a collision. Higher memory efficiency can thus be attained. Note that for reading, care may be taken that reading is done with a suitable read order that prevents collisions. Otherwise the order of the data might be changed.

The distributor (102) comprises a permutator (600) for controllably designating for each specific command a specific distributor output. The permutator (600) has a control input (702) and the designating is reconfigurable under the control of reconfiguration data received at the control input (702).

During operation the distributor (102) receives a sequence of command vectors. The distributor (102) distributes the contents of the command vectors among the plurality of access modules (104). The distributor (102) distributes a read command to that distributor output that is connected, via an access module, to a memory bank that contains the requested data object. Typically the read command comprises an index that is indicative of the physical location where the data is to be retrieved. The distributor (102) selects the distributor output connected to the memory bank that comprises the physical location indicated by the index.

The distributor (102) distributes a write command to that distributor output that is connected, via an access module, to a memory bank that is to store the data object that was supplied with the write command. Typically the write command comprises an index that is indicative of the physical location at which the data is to be stored. The distributor (102) selects the distributor output connected to the memory bank that comprises the physical location indicated by the index.

Typically the distributor (102) works in cycles. In each cycle one command vector is distributed among the distributor outputs. If a command needs access to a particular memory bank, the command is sent to the particular access module that is connected to that memory bank. The particular access module temporarily buffers the command until the memory bank can process the command. If two or more commands need access to the same memory bank, the two or more commands are all sent to the same access module. The access module buffers the commands in the order wherein they were received and forwards the commands to his memory bank, one at a time, when the memory bank can process the command. Typically the memory bank works in cycles, and can process one command in each cycle.

The data handling system (100) can be made using dedicated hardware, such as electronic circuits that are configured according to this invention. The data handling system (100) (106) can be made from generic hardware controlled using software, or the data handling system (100) may comprise a combination of dedicated hardware, generic hardware and software to implement the data handling system (100).

The buffers and memories used, such as memory bank (112) or access module (110) or comprised in the distributor (102) can be made from regular RAM memory, such a DRAM, SRAM or SDRAM, flash memory, magnetic storage, such as a hard disk, or optical storage, or any other kind of suitable storage. Optionally a memory bank (112) could use ROM memory as well. In case ROM is used, the data handling system (100) can only be used for the retrieval of data objects, not for storage.

The connections, between the distributor (102) and the plurality of access modules (104), and between the plurality of access modules (104) and the plurality of memory banks (106) can be fabricated in a number of ways. For example, the connections can use a bus architecture, or the connections can comprise multiple parallel connections, etc.

The distributor (102) is used advantageously in a vector architecture wherein the distributor (102) receives a sequence of command vectors. However, the distributor (102) can also be used if the sequence is a linear sequence of commands. In that case the distributor (102) accepts a number of these commands and regards the set as a vector.

The data handling system (100) according to the invention has numerous advantages. Since the data handling system (100) uses a plurality of access modules (104), the data handling system (100) can gracefully handle a plurality of commands that would otherwise give rise to one or more memory bank conflicts. In case of a conflict there is no need to stall the data handling system (100) or take other corrective action. Commands that address the same memory bank are buffered in an access module and handled by the memory bank in turn. Especially for the case of write command vectors this works conveniently. For read command vectors, a reordering of the order of the read command may occur.

If the reading sequence is chosen such that no bank conflicts will occur, i.e. no vector contains two read commands destined for the same memory bank, the data objects retrieved in response will not be redistributed across multiple data object vectors.

If the reading sequence causes bank conflicts, the distributor (102) can solve these in the same way as conflicts in a writing sequence. However, it may happen that a generated output data vector sequence does not correspond in a one-to-one fashion with the sequence of read command vectors. Should this be a problem, it can be solved at the side of the application using the data handling system. Since the permutator (600) and other components of the data handling system (100) are deterministic, it can be predicted in advance what output sequence will be generated, given a certain input sequence. By permuting the read commands in an input sequence of read commands, and resolving bank conflicts by introducing dummy reads, an input sequence of read command can be constructed that takes into account possible rearrangements caused by the data handling system (100). In this way, an input sequence of read command can be constructed that will give the wanted output data object vector sequence.

In one embodiment, the data handling system (100) is used in an asynchronous design. The commands do not arrive synchronized to a clock, but are supplied when some other component needs to read or write a data object. As a result the commands can come one by one, or some at a time.

Below the effect of access queues is illustrated with a worked example.

This example makes use of 4 memory banks and implements a block interleaving scheme comprising 4 columns and 5 rows. The sequences of virtual indices are as follows:
writing:
0, 1, 2, 3,4,5,6,7,8,9,10,11,12,13,14,15,16,17,18,19.
reading:
0,4,8,12,16,1,5,9,13,17,2,6,10,14,18,3,7,11,15,19.

Mapping these sequences to a 4 bank memory architecture gives the following pairs of (bank index, address) in vectors of 4 pairs. Here the mapping from a virtual index to a bank index is done by computing the virtual index modulo 4, i.e. computing the remainder after division by 4. The address is found by dividing the virtual index by 4 and rounding down.

Note that the writing and reading sequence have been grouped in writing command vectors, respectively in reading command vectors, of each four accesses. This is consistent with a vector architecture using 4 memory banks.
writing:
((0,0),(1,0),(2,0),(3,0)),((0,1),(1,1),(2,1),(3,1)),((0,2),(1,2), (2,2),(3,2)),((0,3),(1,3),(2,3),(3,3)), ((0,4),(1,4),(2,4),(3,4)).
reading:
((0,0),(0,1),(0,2),(0,3)),((0,4),(1,0),(1,1),(1,2)),((1,3),(1,4), (2,0),(2,1)),((2,2),(2,3),(2,4),(3,0)), ((3,1),(3,2),(3,3),(3,4)).

Counting for each reading command vector how many accesses each reading command vector does per bank, the reading vector sequences looks like this:
(4,0,0,0),(1,3,0,0),(0,2,2,0),(0,0,3,1),(0,0,0,4).

The first reading command vector does four access, all to the memory bank 0. The second reading command vector, does 1 access to bank 0, and 3 accesses to bank 1, etc.

When a cyclic permutation is applied, the reading sequence becomes the following:
((0,0),(1,1),(2,2),(3,3)),((0,4),(1,0),(2,1),(3,2)),((0,3),(1,4), (2,0),(3,1)),((0,2),(1,3),(2,4),(3,0)), ((0,1),(1,2),(2,3),(3,4)).
Again in terms of access per bank:
(1,1,1,1),(1,1,1,1),(1,1,1,1),(1,1,1,1),(1,1,1,1).

Comparing these results, we find that both writing sequences have their accesses spread equally over the banks. However, the reading sequence without a permutator is spread unevenly over the memory banks. The reading sequence with a permutator is spread evenly over the memory banks. A cyclic permutation has a beneficial effect for this interleaving scheme, since the cyclic permutation provides a uniform distribution of accesses over the banks per vector.

Although the access modules, comprising access queues, may introduce additional latency to the interleaving operation, this will be acceptable for most interleaving schemes. Especially, if the interleaving schemes is used in a latency tolerant application.

In one embodiment of the distributor (102) each distributor output has a corresponding access module number. Each specific read command comprises a specific index. The distributor (102) computes a specific computed access module number by computing the index modulo the number of memory banks in the plurality of memory banks (106). The distributor (102) distributes the specific read command to the distributor output corresponding to the specific computed access module number.

In a further refinement of this embodiment of the distributor (102), the number of memory banks is a power of 2. The computing modulo the number of memory banks is implemented as a bitwise 'AND' operation with a bit mask.

Figure 3:
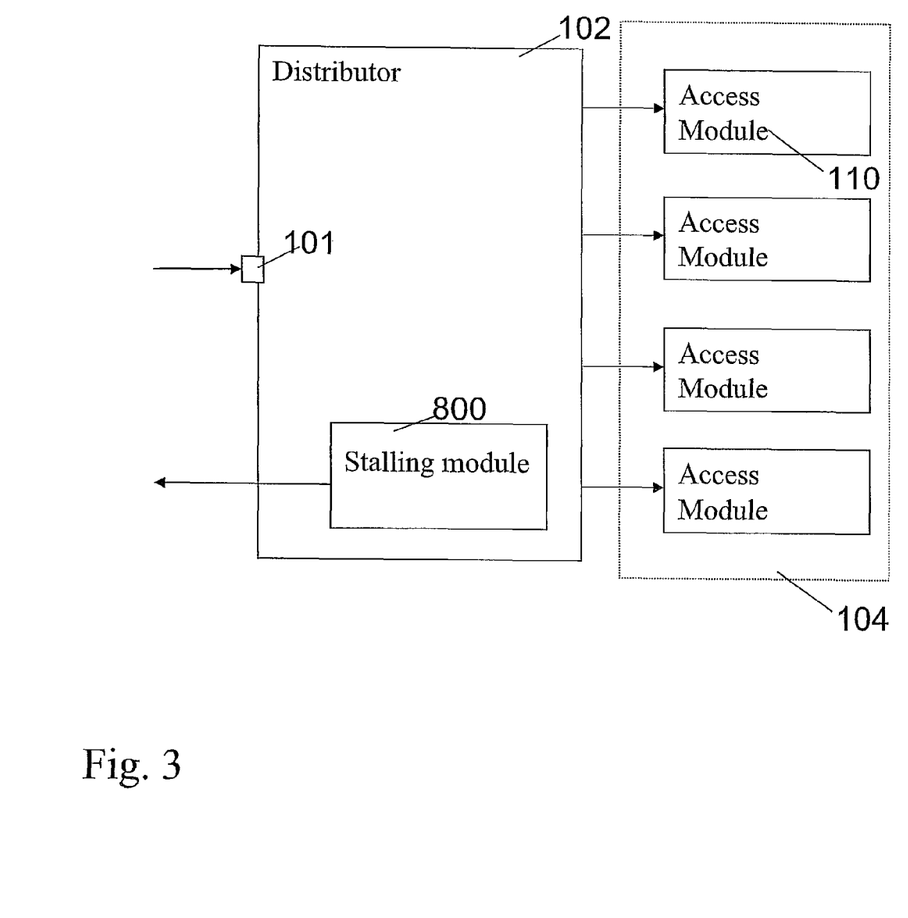
FIG. 3 is a block diagram illustrating a stalling module comprised in a distributor.

FIG. 3 illustrates how a stalling module (800) may fit in the data handling system (100). The distributor (102) comprises the stalling module (800). The stalling module (800) can deliver a signal external to the data handling system (100) indicating that the data handling system (100) is currently unable to accommodate new commands.

In the first embodiment of the stalling module (800), the stalling uses the following method. After an access module receives a command from the distributor (102) for buffering, the access module sends a confirmation signal to the stalling module (800). The confirmation signal signals whether the received command fits in the access module or whether the command did not fit and was discarded. If the stalling module (800) does not receive a confirmation signal that signals that an access module was full and had to discard the command, the stalling module (800) allows the distributor (102) to proceed with the next command vector. However, if the stalling module (800) receives a confirmation signal indicating that an access module is full, the stalling module (800) will then send a signal to the plurality of access modules (104), that those access modules which buffered the most recent command must discard the most recent command. At this point the stalling module (800) signals externally that the data handling system (100) is currently unable to accommodate new commands. Hereafter, the distributor (102) retries sending the same set of commands.

In a second embodiment of the stalling module (800), all access modules signal each time to the stalling module (800) whether they are substantially full or not. The stalling module can signal to the access modules if the last received command is valid or not. This stalling embodiment uses the following method. If an access module determines that the access module is substantially full, the access module signals to the stalling module (800) that the access module is substantially full. If the stalling module (800) receives a signal that at least one access module is substantially full, the stalling modules (800) marks the last command in each access module as invalid. At this point the stalling module (800) signals externally that the data handling system (100) is currently unable to accommodate new commands. If, hereafter, the stalling method (800) receives from none of the access modules a signal that the access module is substantially full, the stalling module (800) causes the distributor (102) to resend the command to the access module that discarded a command, and the stalling module (800) marks all commands as valid. The advantage is that no commands need to be discarded in the access modules.

If the stalling module (800) has the data handling system (100) stalled, the plurality of access modules (104), the memory banks (106) continue the handling of already accepted commands. In this way, the access modules free up buffer space so that new commands can be accepted again.

In a further embodiment of the permutator (600), the permutator (600) performs a processing of the received index. According to the result, the distributor (102) distributes, i.e. selects a distributor output for, the command.

If bank conflicts are, at least to a certain extent, not uniformly distributed over the plurality of memory banks (106) then the access modules will be full more often. A full access module may stall the system. One solution to this problem is increasing the buffer capacity of the access modules. However, using a permutator (600) provides a better solution. With a permutator (600) small access modules can be used, while still avoiding bank conflicts.

A good choice for the permutator (600) is to use a relative cyclic shift permutation. The number of shifts is indicated by the write access vector number of the data element. The cyclic shift permutation is, for example, suitable for the standards: 802.11a/g, DVB, UMTS HSDPA and UMTS R99.

The write access vector number can be obtained by counting the write command vectors as they arrive at the distributor (102). The first write command vectors has write access vector number 1, the second write command vectors has write access vector number 2, and so on. Alternatively, if the pattern of access is known, for example, if a known interleaving pattern is used, the write access vector number can be obtained by a processing of the index comprised in a command in the vector, for example, the first command.

In a further embodiment the distributor (102) makes a provisional assignment to a distributor output for each received index. The permutator (600) can redistribute this provisional assignment. Alternatively, the permutating can be functionally integrated with the distributing.

The permutation, applied by the permutator (600), is used for a whole interleaving block. This permutation is to be performed on the write accesses and read accesses, thereby canceling its effect on the final element order. By performing this permutation, the local non-uniformity of bank conflicts is broken and the gained uniformity can be exploited for parallelism. Since the access sequences for interleaving are deterministic, a simulation can determine the particular permutation resulting in the best distribution of bank conflicts for every individual interleaving scheme.

In one embodiment of the permutator (600), each distributor output has a corresponding access module number. Each specific read command comprises a specific index. The permutator (600) is arranged to compute a specific access module number by processing the specific index in accordance with a bank function. The distributor (102) distributes the specific read command to a distributor output corresponding to the specific access module number. This embodiment of the permutator (600) could be combined with any embodiment of the invention that uses a permutator (600). The bank function could be computed as follows.

1. dividing the index by the number of memory banks, if necessary rounding the result down.
2. adding the result of the division to the index.
3. computing the result of the adding modulo the number of memory banks.

If the number of memory banks is a power of two, this division, and other divisions, can be implemented as a bitwise shift. Note that the result of a first number modulo a second number can computed as follows: the first number is divided by the second number, the result is rounded down, this is the integer quotient. Next the second number is multiplied by the integer quotient, the result of the multiplication is subtracted from the first number. The result is the integer remainder. The integer remainder is the result of the first number modulo the second number. The person skilled in the art is well versed in the art of arithmetic, including modulo operations.

This bank function can also be advantageously implemented in hardware, by first selecting a memory bank according to a number of bits of the index, for example, a number of the most significant bits, and second shifting to a next memory bank a second number of times. The second number is indicated by a second number of bits of the index, for example, a number of the least significant bits of the index.

In general, bank functions need not be executed by an arithmetical processor, although this is possible. It may be advantageously to lay down the bank functions in hardware circuits that perform an equivalent computation. The equivalent computation may only be visible in the fact that a distributor output is chosen based on the index.

The bank function can also be computed as computing the result of the index modulo the number of memory banks. This bank function is, e.g., advantageous for linear reads, e.g., an index sequence of 0, 1, 3, etc, Those skilled in the art will appreciate that the bank functions described above can be implemented in any number of variations and in many suitable ways, e.g., in hardware, in software, or in a combination thereof, without departing from the present invention. For example, the order of certain operations carried out can often be varied, additional operations can be added or operations can be deleted without departing from the invention In FIG. 4 an embodiment of the reconfiguration module (700) is illustrated. The permutator (600) comprises a reconfiguration module (700). The reconfiguration module (700) can receive a reconfiguration data at the control input (702).

Figure 4:
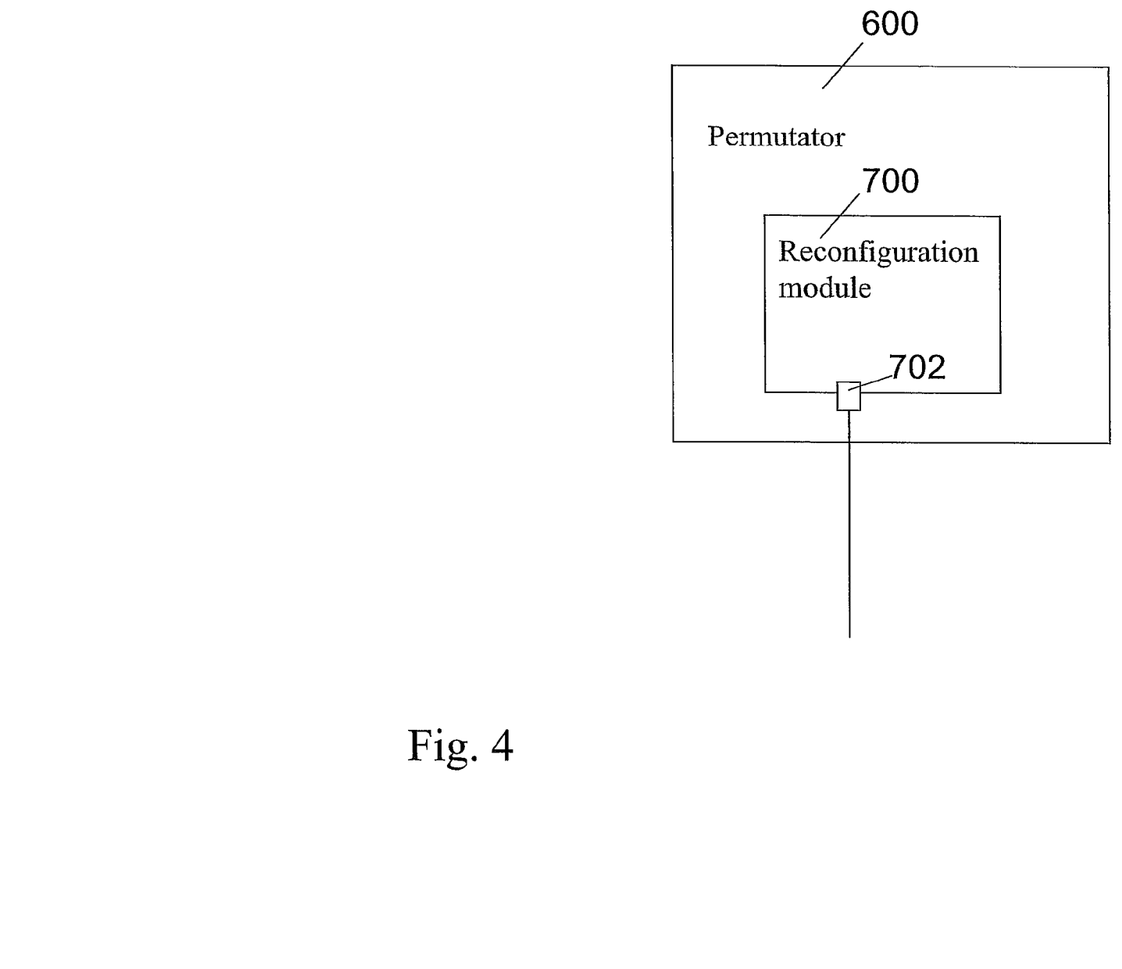
FIG. 4 is a block diagram illustrating an embodiment of a reconfiguration module.

In operation the reconfiguration module (700) receives a reconfiguration data. The reconfiguration data instructs the reconfiguration module (700) to reconfigure the permutator (600) to use a different permutation scheme.

Making the permutator (600) reconfigurable has the advantage that multiple interleaving schemes can be supported. It may happen that one configuration of the permutator (600) is particularly effective for breaking up the patterns causing bank conflicts for one type of interleaving, yet is not effective or, worse, counter productive for another interleaving scheme.

It is conceivable that a permutator (600) in a particular configuration can remove all conflicts for one interleaving scheme, yet introduce conflicts in another interleaving scheme. This problem is solved by reconfiguring the permutator (600) in anticipation of the interleaving scheme that is about to be used. One way of reconfiguring is by having multiple permutators, or multiple permutation options within the permutator (600), and choosing one among them.

The reconfiguration data can comprise among others, one or more of: a representation of a bank function, a representation of an address functions, and one or more parameters for use in such functions. Also, the reconfiguration data can comprise the particular application or operation to be performed, the distributor, or a permutator (600), could select a way of distributing i.e. adapting his selectivity, from a table stored in a memory comprised in the distributor (102). For example, the reconfiguration data can comprise a type of interleaving scheme.

One way of reconfiguring is to turn a permutator (600) on or off. It is found that already a great advantage is achieved if the distributor (102) has the option of choosing between two types of distribution, e.g., one with, and one without a permutator (600).

One way to use the reconfiguration is as follows. At manufacture, the distributor (102) is prepared for one or more types of permutation schemes. During use, a table is stored. In the table the optimal permutation type is kept for each communication protocol. The table may be precomputed once, and stored on the device during manufacturing, or stored later, for example, downloaded from a server. The device may also try different types of permutators for each protocol and store the permutation that worked best.

Reconfiguration has the advantage that the best option can be applied for a particular application. For example, if the data handling system (100) is used for multiple communication standards, each with a different interleaving scheme, the data handling system (100) can be optimized for each communication standard.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

The invention claimed is:

1. A data handling system, wherein the data handling system is configured for receiving, at an input, a plurality of commands, the data handling system comprising:
a plurality of memory banks;
a distributor connected to the input and having a plurality of distributor outputs; and
an output, wherein the plurality of commands comprises at least one read command and each specific one of the plurality of memory banks is configured for producing, at the output, a particular data object in response to receiving a particular read command from the distributor, the plurality of commands is organized as a first sequence of command vectors, the data objects appearing at the output are organized as a second sequence of data object vectors, each specific one of the plurality of memory banks is connected to a specific one of the plurality of distributor outputs, the distributor comprises a permutator configured to designate, for each specific command, a specific distributor output so that the distributor distributes the specific command to the designated distributor output, and the permutator has a control input configured to receive reconfiguration data that control the designation of the specific distributor output.

2. The data handling system as claim 1, wherein at least one specific memory bank of the plurality of memory banks is connected to the specific distributor output through a specific access module that is configured to buffer at least one command occurring at the specific distributor output.

3. The data handling system as in claim 1, wherein the plurality of commands comprises at least one write command, the at least one write command comprises a data object, and each specific one of the plurality of memory banks is configured for storing a particular data object in response to receiving a particular write command from the distributor.

4. The data handling system as in claim 1, wherein each specific command comprises a specific index and the permutator is configured to designate, for each specific command, a specific distributor output corresponding to a processing of the specific index.

5. The data handling system as in claim 4, wherein the permutator is further configured to compute a specific address by processing the specific index in accordance with an address function, each memory bank is configured to store or retrieve a specific data object in accordance with the specific address, and the processing of the specific index comprises adding the specific address to the specific index.

6. The data handling system as in claim 1, wherein the distributor further comprises:
a stalling module; and
at least one distinct access module that is configured to signal the stalling module if the distinct access module is substantially full, wherein the stalling module is configured to temporarily disable the distributor.

7. A method of handling data and reconfiguring a permutator, the method comprising:
receiving, at an input, a plurality of commands, wherein the plurality of commands comprises at least one read command and is organized as a first sequence of command vectors;
designating, using the permutator, for each specific command in the plurality of commands, a specific one of a plurality of distributor outputs;
distributing the specific command to the designated distributor output, said designated distributor output being connected to a specific memory, wherein each memory is configured to produce, at an output, a particular data object in response to receiving a particular read command, and data objects appearing at the output are organized as a second sequence of data object vectors;
receiving reconfiguration data at a control input; and
reconfiguring the designating step under the control of the reconfiguration data.

8. The method of claim 7, further comprising:
writing a set of data objects according to a first plurality of write commands; and
reading the set of data objects according to a second plurality of read commands.

9. A non-transitory machine-readable storage medium comprising:
instructions for receiving, at an input, a plurality of commands, wherein the plurality of commands comprises at least one read command and is organized as a first sequence of command vectors;
instructions for designating, using the permutator, for each specific command in the plurality of commands, a specific one of a plurality of distributor outputs;
instructions for distributing the specific command to the designated distributor output, said designated distributor output being connected to a specific memory, wherein each memory is configured to produce, at an output, a particular data object in response to receiving a particular read command, and data objects appearing at the output are organized as a second sequence of data object vectors;
instructions for receiving reconfiguration data at a control input; and
instructions for reconfiguring the designating step under the control of the reconfiguration data.

* * * * *